United States Patent
Ueno

(10) Patent No.: US 8,599,996 B2
(45) Date of Patent: Dec. 3, 2013

(54) COUNTING DEVICE AND COUNTING METHOD

(75) Inventor: Tatsuya Ueno, Tokyo (JP)

(73) Assignee: Azbil Corporation, Tokyo (JP)

( * ) Notice: Subject to any disclaimer, the term of this patent is extended or adjusted under 35 U.S.C. 154(b) by 44 days.

(21) Appl. No.: 13/420,683

(22) Filed: Mar. 15, 2012

(65) Prior Publication Data

US 2012/0257708 A1    Oct. 11, 2012

(30) Foreign Application Priority Data

Apr. 5, 2011   (JP) .................................. 2011-083425

(51) Int. Cl.
   *G01F 15/06*    (2006.01)
(52) U.S. Cl.
   USPC ................. 377/27; 327/19; 327/28; 702/158
(58) Field of Classification Search
   None
   See application file for complete search history.

(56) References Cited

U.S. PATENT DOCUMENTS

| 7,684,957 | B2 * | 3/2010 | Ueno | 702/158 |
| 7,911,593 | B2 * | 3/2011 | Ueno | 356/28.5 |
| 7,961,302 | B2 * | 6/2011 | Ueno | 356/28.5 |
| 2010/0332171 | A1 * | 12/2010 | Ueno | 702/71 |
| 2012/0004877 | A1 * | 1/2012 | Ueno | 702/75 |
| 2012/0010858 | A1 * | 1/2012 | Ueno | 702/189 |

FOREIGN PATENT DOCUMENTS

| JP | 6-294680 A | 10/1994 |
| JP | 2006-313080 A | 11/2006 |
| JP | 2009-47676 A | 3/2009 |
| JP | 2011-33525 A | 2/2011 |

* cited by examiner

*Primary Examiner* — Tuan T Lam
(74) *Attorney, Agent, or Firm* — Troutman Sanders LLP

(57) ABSTRACT

A counter counts the run lengths of a binarized signal. A counting result correcting portion generates frequency distributions for run lengths for first run lengths, which are from a rising edge to a falling edge of the signal, and second run lengths, which are for a falling edge to a rising edge of the signal, calculates a total number of first run lengths of lengths that are no less than 0 times and less than 1 times a representative value for the first run lengths, calculates a total number of second run lengths of lengths that are no less than 0 times and less than 1 times a representative value for the second run lengths, calculates a total number of first run lengths, calculates a total number of second run lengths, and corrects the counting results.

8 Claims, 7 Drawing Sheets

COUNTING DEVICE AND COUNTING METHOD

CROSS REFERENCE TO RELATED APPLICATIONS

The present application claims priority under 35 U.S.C. §119 to Japanese Patent Application No. 2011-083425, filed Apr. 5, 2011, which is incorporated herein by reference.

FIELD OF TECHNOLOGY

The present invention relates to a counting device and a counting method for counting a number of signals.

BACKGROUND

Conventionally, laser measuring devices of a wavelength modulating type have been proposed that use the self-coupling effect of semiconductor lasers (See Japanese Unexamined Patent Application Publication 2006-313080 ("JP '080")). The structure of this type of laser measuring device is illustrated in FIG. 9. The laser measuring device of FIG. 9 includes a semiconductor laser 201 for emitting a laser beam at an object 210; a photodiode 202 for converting into an electric signal the optical power of the semiconductor laser 201: a lens 203 that focuses a beam from the semiconductor laser 201 to direct it to an object 210, and that focuses a return beam from the object 210 to inject it into the semiconductor laser 201; a first laser driver 204 for repetitively alternating between a first emission interval over which the emission wavelength of the semiconductor laser 201 increases continuously and a second emission interval over which the emission wavelength decreases continuously; an electric current/voltage converting/amplifying portion 205 for converting the outputted electric current from the photodiode 202 into a voltage, and then amplifying; a signal extracting circuit 206 for performing double differentiation on the outputted voltage of the electric current/voltage converting/amplifying portion 205; a counting device 207 for counting the number of mode hope pulses (hereinafter termed "MHPs") included in the outputted voltage of the signal extracting circuit 206; a calculating device 208 for calculating the distance to the object 210 and the speed of the object 210; and a displaying device 209 for displaying the results of the calculations by the calculating device 208.

The laser driver 204 provides, as an injected electric current into the semiconductor laser 201, a triangle wave driving current that repetitively increases and decreases at a constant rate of change in respect to time. Doing so drives the semiconductor laser 201 so as to repetitively alternate between a first emission interval, wherein the emission wavelength increases continuously at a constant rate of change, and a second emission interval over which the emission wavelength is reduced continuously at a continuous rate of change. FIG. 10 is a diagram illustrating the change, in respect to time, of the emission wavelength of the semiconductor laser 201. In FIG. 10, P1 is the first emission interval, P2 is the second emission interval, λa is the minimum value of the emission wavelength in each of the intervals, λb is the maximum value for the emission wavelength in each of the intervals, and Tt is the period of the triangle wave.

The laser beam that is emitted from the semiconductor laser 201 is focused by the lens 203, to be incident on the object 210. The beam that is reflected from the object 210 is focused by the lens 203 to be injected into the semiconductor laser 201. The photodiode 202 converts the optical power of the semiconductor laser 201 into an electric current. The electric current/voltage converting/amplifying portion 205 converts the outputted electric current from the photodiode 202 into a voltage, and then performs amplification, and the signal extracting circuit 206 performs double differentiation on the outputted voltage from the electric current/voltage converting/amplifying portion 205. The counting device 207 counts the number of MHPs included in the outputted voltage from the signal extracting circuit 206 in the first emission interval and the second emission interval P2, separately. The calculating device 208 calculates the distance of the object 210 and the speed of the object 210 based on the minimum emission wavelength λa and the maximum emission wavelength λb the semiconductor laser 201, the number of MHPs in the first emission interval P1, and the number of MHPs in the second emission interval P2. The use of this self-coupled laser measurement device technology makes it possible to measure the number of MHPs to calculate a vibration frequency for the object from the numbers of MHPs.

The laser measuring device as described above has a problem in that there will be error in the number of MHPs that are counted by the counting device when, for example, counting noise such as external light as MHPs or when there are MHPs that are not counted due to missing signals, producing error in the physical quantities that are calculated, such as the distance and the vibrational frequency.

Given this, a counting device was proposed that is able to eliminate the effects of undercounting or overcounting at the time of counting through measuring the period of the MHPs during the counting interval, producing a distribution of the counts of the periods within the counting interval from the measurement results, calculating representative values for the periods of the MHPs from the frequency distribution, calculating, based on the frequency distribution, a total Ns of the frequencies in each bin that is no more than a first specific multiple of the representative value and calculating a total Nw of the frequencies of the bins that are no less than a second specific multiple of the representative value, and correcting the result for counting the MHPs based on these frequencies Ns and Nw (See Japanese Unexamined Patent Application Publication 2009-47676 ("JP '676")).

The counting device disclosed in JP '676 is able to perform generally good correction insofar as the SN (signal-to-noise ratio) is not extremely low.

However, in the counting device disclosed in JP '676, in some cases a large number of signals with periods that are about one half of the actual period of the MHP, or signals with short periods, may be produced through the occurrence of chattering due to noise at frequencies higher than those of the MHPs near to a threshold value of binarization of the signals inputted into the counting device when, in a measurement of a short distance, the signal strength is extremely strong when compared to the hysteresis width. In this case, a period that is shorter than the actual period of the MHP will be used as the representative value for the distribution of periods, making it impossible to correct the MHP counting result properly, and thus there is a problem in that the MHP counting result may be, for example, several times larger than the actual value.

Given this, another counting device is proposed that is able to correct counting error even in a case wherein high-frequency noise is produced continuously in the input signal (See Japanese Unexamined Patent Application Publication 2011-33525 ("JP '525")). The measuring device disclosed in JP '525 counts the number of run lengths of input signals during the counting interval, measures the run lengths of the input signal during the counting interval, constructs a frequency distribution of the run lengths of the input signals in the measurement period from the measurement results, calculates a representative value for the distribution of run lengths in the input signal from this frequency distribution, calculates a total Ns for the number of run lengths that are less than 0.5 times the representative value and a total Nwn number of run lengths that are no less than 2n times the representative value and less than (2n+2) times the representative value (where n is a natural number no less than 1), and corrects the MHP counting result based on these frequencies Ns and Nwn.

However, the waveform of an interference pattern such as an MHP is asymmetrical in respect to time due to the characteristics of the carrier wave-removing circuit and the state of the target object (See Japanese Patent 3282746). FIG. 11(A) is a diagram illustrating an interference waveform that is asymmetrical in this way, and FIG. 11(B) is a diagram illustrating the result of binarization of the waveform in FIG. 11(A). TH1 and TH2 in FIG. 11(A) are threshold values for binarization. When the interference waveform is asymmetrical in respect to time in this way, the duty ratio of the binarized signal will not be 0.5. Given this, the counting device disclosed in JP '525 has a problem in that the accuracy with which the count is corrected will suffer.

The counting device disclosed in JP '525 is able to correct counting error even in cases wherein high-frequency noise is produced in the input signal.

However, the counting device disclosed in JP '525 has a problem in that the accuracy of the correction to the count will suffer because the duty ratio of the signal wherein the interference waveform is binarized will not be 0.5 when the interference waveform is asymmetrical in respect to time.

The present invention was created in order to solve the problems set forth above, and the object thereof is to provide a counting device and counting method able to correct accurately the counting result even in cases wherein the signal that is inputted into the counting device is asymmetrical in respect to time.

SUMMARY

Examples of the present invention are a counting device for counting signals wherein there is a linear relationship between a specific physical quantity and the number of signals and wherein the signal has essentially a single frequency when the specific physical quantity is constant, having binarizing means for binarizing an inputted signal; signal counting means for counting a number of run lengths of the binarized signal outputted from the binarizing means during a prescribed counting interval; run length measuring means for measuring the run lengths of a binarized signal during the counting interval each time a run length worth of a signal is inputted; frequency distribution generating means for generating a frequency distribution for the run lengths of the binarized signals during the counting interval, from the measurement results by the run length measuring means, for first run lengths, which are from a rising edge until the subsequent falling edge of the binarized signal, and second run lengths, which are from a falling edge to the subsequent rising edge of the binarized signal; representative value calculating means for calculating a representative value $T_H$ for the distribution of the first run lengths from the first run length frequency distribution and for calculating a representative value $T_L$ for the distribution of the second run lengths from the second run length frequency distribution; and corrected value calculating means for calculating a total $Ns_H$ number of first run lengths wherein the length is no less than 0 times and less than 1 times the representative value $T_H$, a total $Ns_L$ number of second run lengths wherein the length is no less than 0 times and less than 1 times the representative value $T_L$, a total $Nw_{nH}$ number of first run lengths wherein the lengths are no less than $\{T_H+n-0.5)\times(T_H+T_L)\}$ and less than $\{T_H n+0.5)\times(T_H+T_L)\}$, and a total $Nw_{nL}$ number of second run lengths wherein the lengths are no less than $\{T_L+n-0.5)\times(T_H+T_L)\}$ and less than $\{T_L+n+0.5)\times(T_H+T_L)\}$, and for calculating a number of inputted signals by correcting the counting results by the signal counting means based on these frequencies $Ns_H$, $Ns_L$, and $Nw_{nH}$, and $Nw_{nL}$.

Moreover, in one example configuration of a counting device according to the present example the corrected value calculating means calculate a post-correction calculation result N' through:

[Equation 1]

$$N' = \frac{1}{2}\left[N - (Ns_H + Ns_L) + \sum_{n=1}^{n_{max}} \{2n \times (Nw_{nH} + Nw_{nL})\}\right]$$

$$n_{max} \leq \frac{(T_H + T_L)_{max}}{T_H + T_L}$$

when the counting result by the signal counting means is defined as N, and the maximum value that can be assumed by the sum of a first run length and a second run length is defined as $(T_H+T_L)_{max}$.

Moreover, in one example configuration of a counting device according to the present invention, the representative values $T_H$ and $T_L$ are each a median value, a modal value, a mean value, a bin value wherein the product of the bin value and the frequency is a maximum, or a bin value wherein the product of the bin value raised to the a power (where 0<a<1) and the frequency is a maximum.

Moreover, in one example configuration of a counting device, a threshold value for calculating the total $Ns_H$ number of first run lengths is no less than 0 times and less than 0.5 times the representative value $T_H$ or no less than 0 times the representative value $T_H$ and less than $(T_H+T_L)/4$, and a threshold value for calculating the total $Ns_L$ number of second run lengths is no less than 0 times and less than 0.5 times the representative value $T_L$, or no less than 0 times the representative value $T_L$ and less than $(T_H+T_L)/4$.

Moreover, the present example is a counting method for counting signals wherein there is a linear relationship between a specific physical quantity and the number of signals and wherein the signal has essentially a single frequency when the specific physical quantity is constant, including a binarizing step for binarizing an inputted signal; a signal counting step for counting a number of run lengths of the binarized signal outputted from the binarizing step during a prescribed counting interval; a run length measuring step for measuring the run lengths of a binarized signal during the counting interval each time a run length worth of a signal is inputted; a frequency distribution generating step for generating a frequency distribution for the run lengths of the binarized signals during the counting interval, from the measurement results by the run length measuring step, for first run lengths, which are from a rising edge until the subsequent falling edge of the binarized signal, and second run lengths, which are from a frilling edge to the subsequent rising edge of the binarized signal; a representative value calculating step for calculating a representative value $T_H$ for the distribution of the first run lengths from the first run length frequency distribution and for calculating a representative value $T_L$ for the distribution of the second run lengths from the second run length frequency distribution; and a corrected value calculating step for calculating a total $Ns_H$ number of first run lengths wherein the length is no less than 0 times and less than 1 times the representative value $T_H$, a total $Ns_L$ number of second run lengths wherein the length is no less than 0 times and less than 1 times the representative value $T_L$, a total $Nw_{nH}$ number of first run lengths wherein the lengths are no less than $\{T_H+n-0.5)\times(T_H+T_L)\}$ and less than $\{T_H+n+0.5)\times(T_H+T_L)\}$, and a total $Nw_{nL}$ number of second run lengths wherein the lengths are no less than $\{T_L+n-0.5)\times(T_H+T_L)\}$ and less than $\{T_L+n+0.5)\times(T_H+T_L)\}$, and for calculating a number of inputted signals by correcting the counting results by the signal counting step based on these frequencies $Ns_H$, $Ns_L$, and $Nw_{nH}$, and $Nw_{nL}$.

Moreover, in one example configuration of a counting method according to the present example, the corrected value calculating step calculates a post-correction calculation result N' through:

[Equation 2]

$$N' = \frac{1}{2}\left[N - (Ns_H + Ns_L) + \sum_{n=1}^{n_{max}}\{2n \times (Nw_{nH} + Nw_{nL})\}\right]$$

$$n_{max} \leq \frac{(T_H + T_L)_{max}}{T_H + T_L}$$

when the counting result by the signal counting step is defined as N, and the maximum value that can be assumed by the sum of a first run length and a second run length is defined as $(T_H+T_L)_{max}$.

In the present examples, the input signal is binarized, the number of run lengths of the binarized signal outputted by the binarizing means during a specific counting interval is counted, the run lengths of the binarized signals during the counting interval are measured, frequency distributions for the run lengths of the binarized signals during the counting interval are produced for the measured results for first run lengths that are from a rising edge to the subsequent falling edge of the binarized signal and for second run lengths that are from a falling edge to the subsequent rising edge of the binarized signal, a representative value $T_H$ is calculated, from the frequency distribution of the first run lengths, for the distribution of the first run lengths, and a representative value $T_L$ is calculated, from the frequency distribution of the second run lengths, for the distribution of the second run lengths, a total $Ns_H$ number of first run lengths that are lengths from 0 times to less than 1 times the representative value $T_H$, a total $Ns_L$ number of second run lengths that are lengths from 0 times to less than 1 times the representative value $T_L$, a total $Nw_{nH}$ number of first run lengths that are lengths from $\{T_H+(n-0.5)\times(T_H+T_L)\}$ to less than $\{T_H+(n+0.5)\times(T_H+T_L)\}$ and a total $Nw_{nL}$ number of second run lengths that are lengths from $\{T_L+(n-0.5)\times(T_H+T_L)\}$ to less than $\{T_L+(n+0.5)\times(T_H+T_L)\}$ are calculated, and the counting results of the signal counting means are corrected based on these frequencies $Ns_H$, $Ns_L$, and $Nw_{nL}$, thus making it possible to correct with high accuracy the counting error even when high-frequency noise appears continuously in the signal inputted into the counting device and even if the input signal waveform is asymmetrical in respect to time.

DETAILED DESCRIPTION

Figure 1:
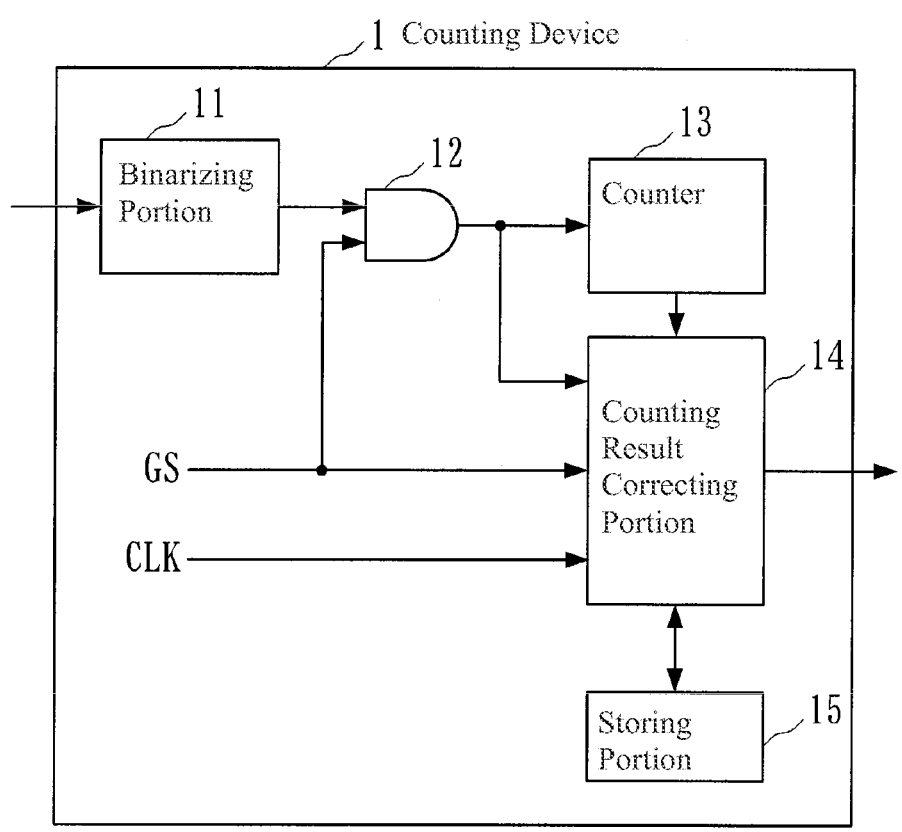
FIG. 1 is a block diagram illustrating a structure for a counting device according to an example of the present invention.
Figure 2:
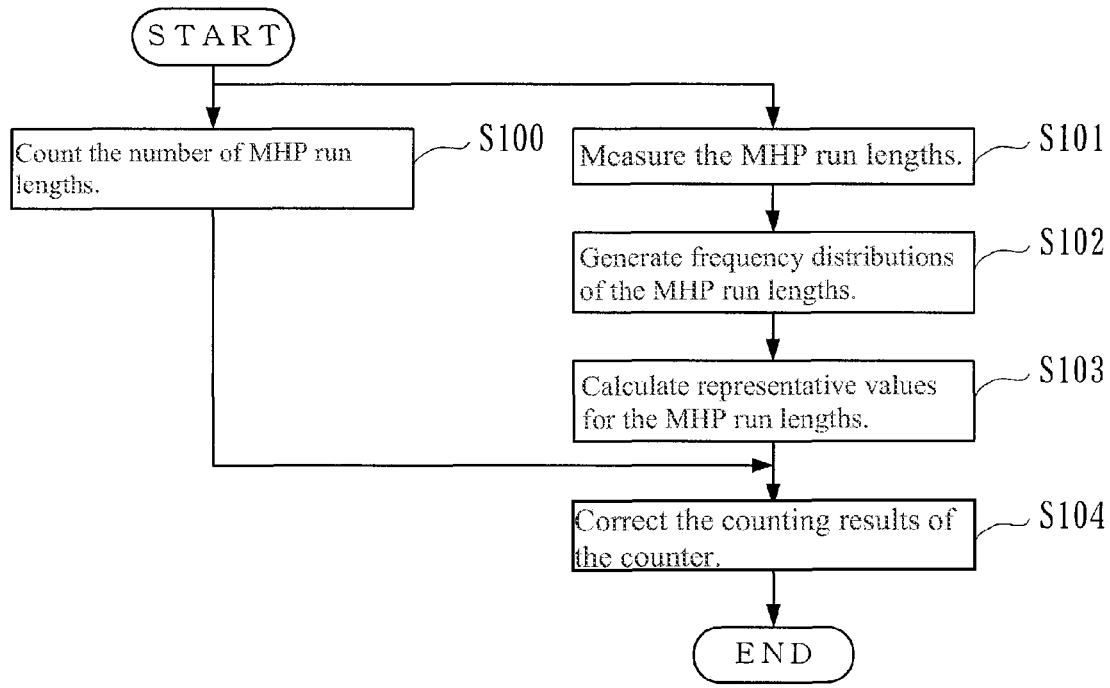
FIG. 2 is a flowchart illustrating the operation of the counting device according to the example of the present invention.

Examples for carrying out the present invention are explained below in reference to the figures. FIG. 1 is a block diagram illustrating a structure for a counting device according to an example of the present invention, and FIG. 2 is a flowchart illustrating the operation of the counting device. The counting device 1 is structured from: a binarizing portion 11; a logical product calculating portion (AND gate) 12; a counter 13; a counting result correcting portion 14; and a storing portion 15. The counter 13 structures signal counting means.

Figure 3:
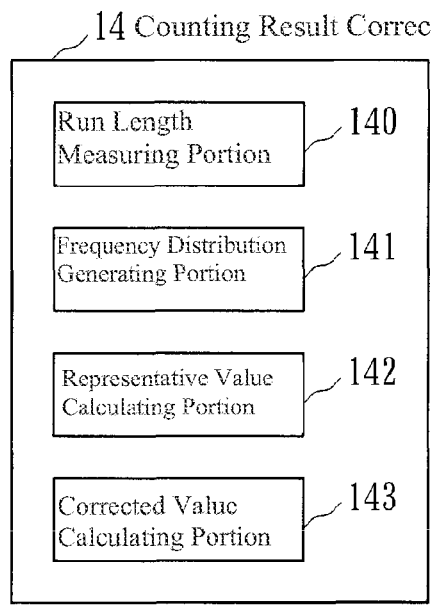
FIG. 3 is a block diagram illustrating one example of a structure of a counting result correcting portion in a counting device according to another example.

FIG. 3 is a block diagram illustrating one example of a structure for the counting result correcting portion 14. The counting result correcting portion 14 is structured from: a run length measuring portion 140; a frequency distribution generating portion 141; a representative value calculating portion 142; and a corrected value calculating portion 143.

Figure 9:
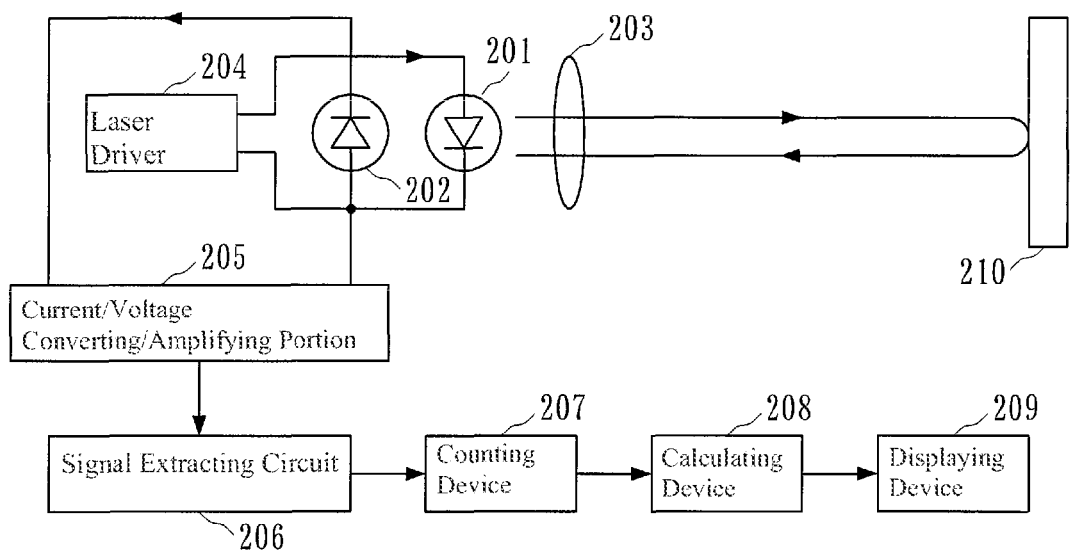
FIG. 9 is a block diagram illustrating a structure for a conventional laser measuring device.
Figure 10:
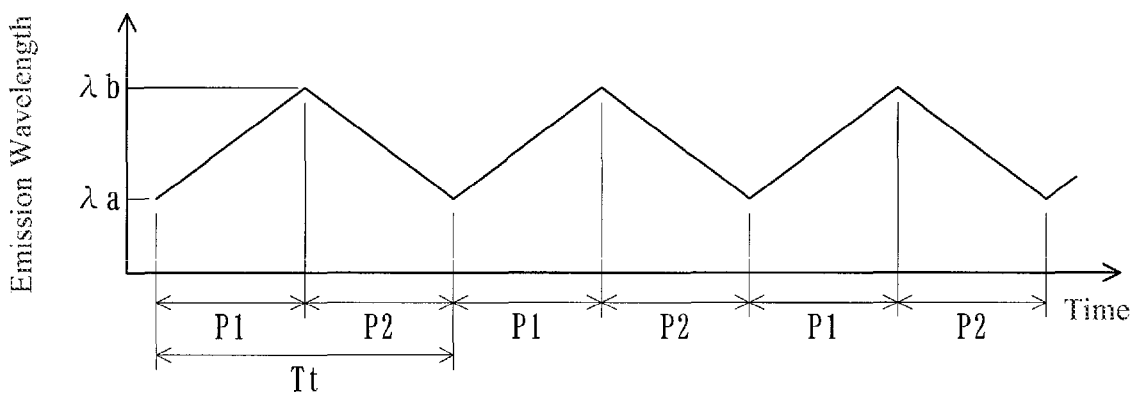
FIG. 10 is a diagram illustrating one example of a time series of emission wavelengths of a semiconductor laser in the laser measuring device according to FIG. 9.

In the example set forth below, the explanation uses a case wherein the counting device 1 is applied to a self-coupled laser measuring device, such as illustrated in FIG. 9, to count the number of mode hop pulses (MHPs) that are the self-coupled signals.

Figure 4:
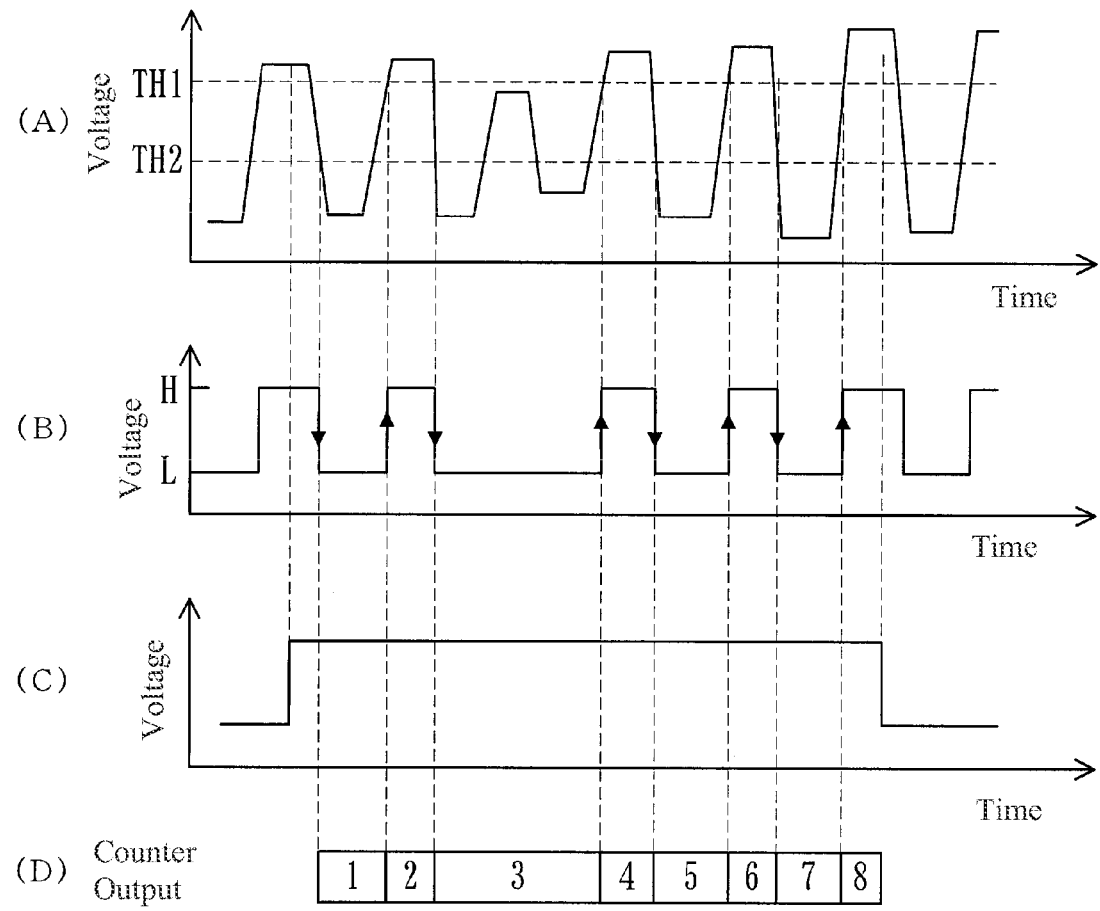
FIG. 4 is a diagram for explaining the operation of a counter in a counting device according to further example of the present invention.

FIG. 4(A) through FIG. 4(D) are diagrams for explaining the operation of the counter 13, wherein FIG. 4(A) is a diagram illustrating schematically the waveform of the signal inputted into the counting device 1, that is, is an MHP waveform; FIG. 4(B) is a diagram illustrating the output of the binarizing portion 11 corresponding to FIG. 4(A); FIG. 4(C) is a diagram illustrating a gate signal GS that is inputted into the counting device 1; and FIG. 4(D) is a diagram illustrating a counting result by the counter 13 corresponding to FIG. 4(B).

First the binarizing portion 11 of the counting device 1 identifies whether the input signal illustrated in FIG. 4(A) is at the high (H) level or the low (L) level, and outputs the identification result as illustrated in FIG. 4(B). At this time, the binarizing portion 11 identifies a high level when the voltage of the input signal rises to be at or above the threshold value TH1, and identifies a tow level when the voltage of the input signal falls to be below a threshold value TH2 (where TH2<TH1), to perform the binarization.

An AND gate 12 outputs the result of the logical product of the output of the binarizing portion 11 and the gate signal GS, as shown in FIG. 4(C), and the counter 13 counts the rising edges and falling edges of the output of the AND gate 12 (the binarized signal) (FIG. 4(D)). At this point, the gate signal GS is a signal that rises at the beginning of the counting interval and falls at the end of the counting interval (which, for example, is a first emission interval P1 or a second emission interval P2 when, for example, the counting device 1 is applied to a self-coupled laser measuring device). Consequently, the counter 13 counts the number of rising edges and the number of falling edges (that is, the number of MHP run lengths) outputted by the AND gate 12, during the counting interval. Consequently, the counter 13 counts the number of rising edges and counts the number of falling edges (that is, the number of MHP run lengths) outputted by the AND gate 12 during the counting interval (Step S100 in FIG. 2).

Figure 5:
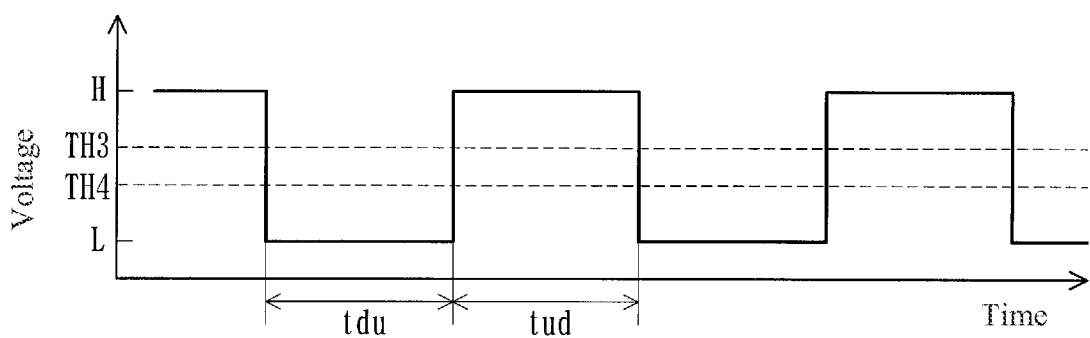
FIG. 5 is a diagram for explaining the operation of a run length measuring portion of a counting device according to a yet further example.

FIG. 5 is a diagram for explaining the operation of the run length measuring portion 140 in the counting result correcting portion 14. The run length measuring portion 140 measures the run lengths of the MHPs during the counting interval (Step S101 in FIG. 2). That is, the run length measuring portion 140, during the counting interval, detects the rising of the output of the AND gate 12 through comparing the output of the AND gate 12 to the threshold value TH3, and detects the falling of the output of the AND gate 12 through comparing the output of the AND gate 12 to the threshold value TH4. Given this, the run length measuring portion 140 measures the time tud from the rising edge of the output of the AND gate 12 to the subsequent falling edge, and measures the time tdu from the falling edge of the output of the AND gate 12 to the subsequent rising edge, to measure the run lengths of the output of the AND gate 12 during the measuring interval through measuring the time tdu from the falling edge of the output of the AND gate 12, to the subsequent rising edge thereof to thereby measure the run lengths of the output of the AND gate 12 during the counting interval (that is, to measure the MHP run lengths). In this way, the MHP run lengths are the times tud and tdu. The run length measuring portion 140 performs the measurement as described above each time there is a rising edge in the output of the AND gate 12, each time there is a rising edge or a falling edge in the AND gate 12 output.

The storing portion 15 stores the containing results of the counter 13 and the measurement results of the run length measuring portion 140.

After the gate signal GS has fallen and the counting interval has been completed, then the frequency distribution generating portion 141 of the counting result correcting portion 14 generates frequency distributions of the MHP run lengths tud and tdu for the counting interval from the measurement results of the run length measuring portion 140, which are stored in the storing portion 15 (Step S102 in FIG. 2). At this time, the frequency distribution generating portion 141 generates frequency distributions for the first run lengths tud of the rising edges through the subsequent falling edges of the MHPs, and for the second run lengths tdu for the falling edges through the subsequent rising edges of the MHPs.

Following this, the representative value calculating portion 142 of the counting result correcting portion 14 both calculates a representative value $T_H$ for the first run lengths tud from the frequency distribution for the first run lengths tud, generated by the frequency distribution generating portion 141 and calculates a representative value $T_L$ for the second run lengths tdu from the frequency distribution for the second run lengths tdu, generated by the frequency distribution generating portion 141 (Step S103 in FIG. 2). Here the representative value calculating portion 142 may use the mode value, median value, or mean value of the first run lengths tud as the representative value $T_H$, or may use the bin value wherein the product of the bin value and the frequency is maximal as the representative value $T_H$, or may instead use the bin value wherein the product of the a power (wherein 0<a<1) of the bin value and the frequency is maximal as the representative value $T_H$. The representative value $T_L$ for the second run lengths tdu may be calculated in the same way as the representative value $T_H$. Table 1 illustrates a numerical example of a frequency distribution, and the products of the bin values and the frequencies thereof in this example of numerical values.

TABLE 1

Example of Numerical Values in a Frequency Distribution

| Bin Value | 1 | 2 | 3 | 4 | 5 | 6 | 7 | 8 | 9 | 10 |
|---|---|---|---|---|---|---|---|---|---|---|
| Frequency | 11 | 2 | 0 | 3 | 7 | 10 | 6 | 2 | 3 | 1 |
| Product | 11 | 4 | 0 | 12 | 35 | 60 | 42 | 16 | 27 | 10 |

In the example in Table 1, the value (the bin value) with the highest count, wherein the count was the maximum, is 1. In contrast, the bin value wherein the product of the device and the count was a maximum was 6, a value that is different from the value with the highest frequency. The reason for using, for the representative values $T_H$ and $T_L$, the bin value wherein the product of the bin value and the frequency is disclosed in JP '525, and thus the explanation is omitted here. The representative values $T_H$ and $T_L$, calculated by the representative value calculating portion 142, are stored in a storing portion 15. The representative value calculating portion 142 calculates these representative values $T_H$ and $T_L$ each time a frequency distribution is generated by the frequency distribution generating portion 141.

The corrected value calculating portion 143 of the counting result correcting portion 14 calculates, from the results of measurements by the run length measuring portion 140 and the results of the calculations by the representative value calculating portion 142, a total $Ns_H$ for the number of first run lengths tud wherein the lengths are no less than 0 times and less that 1 times the representative value $T_H$, a total $Ns_L$ number of second run lengths tdu wherein the lengths are no less than 0 times and less than 1 times the representative value $T_L$, a total $Nw_{nH}$ number of first run lengths tud wherein the lengths are no less than $\{T_H+(n-0.5)\times(T_H+T_L)\}$ and less than $\{T_H+(n+0.5)\times(T_H+T_L)\}$, and a total $Nw_{nL}$ number of second run lengths tdu wherein the lengths are no less than $\{T_L+(n-0.5)\times(T_H+T_L)\}$ and less than $\{T_L+(n+0.5)\times(T_H+T_L)\}$, and corrects the counting results by the counter 13 as in the following equation (Step S104 in FIG. 2).

Equation 3

$$N' = \frac{1}{2}\left[N - (Ns_H + Ns_L) + \sum_{n=1}^{n_{max}} \{2n \times (Nw_{nH} + Nw_{nL})\}\right] \quad (1)$$

$$n_{max} \leq \frac{(T_H + T_L)_{max}}{T_H + T_L}$$

In equation 1, N is the number of MHP run lengths that is the result of counting by the counter 13, N' is the number of MHPs obtained after the correction, and $(T_H+T_L)_{max}$ is the maximum number produced by a sum of a first run length tud and a second run length tdu. The threshold value for calculating the total $Ns_H$ number of first run lengths tud may be no less than 0 and less than 0.5 times the representative value $T_H$, or may be no less than 0 times the representative value $T_H$ and less than $(T_H+T_L)/4$. Similarly, the threshold value for calculating the total $Ns_L$ number of second run lengths tdu may be no less than 0 and less than 0.5 times the representative value $T_L$, or may be no less than 0 times the representative value $T_L$ and less than $(T_H+T_L)/4$. The counting device 1 performs the processing as described above in each counting interval.

The principal for correcting the counting results of the counter 13 in the counting device 1 is explained next. The fundamental principle for correcting the counting results, illustrated in Equation (1), is identical to the principal for correcting the counting results disclosed in JP '676. However, in the principal for correcting as disclosed in JP '676, there are cases wherein the counting results by the counter 13 could not be corrected well when burst noise of a frequency higher than that of the MHPs is mixed into the signal that is inputted into the counting device.

Figure 6:
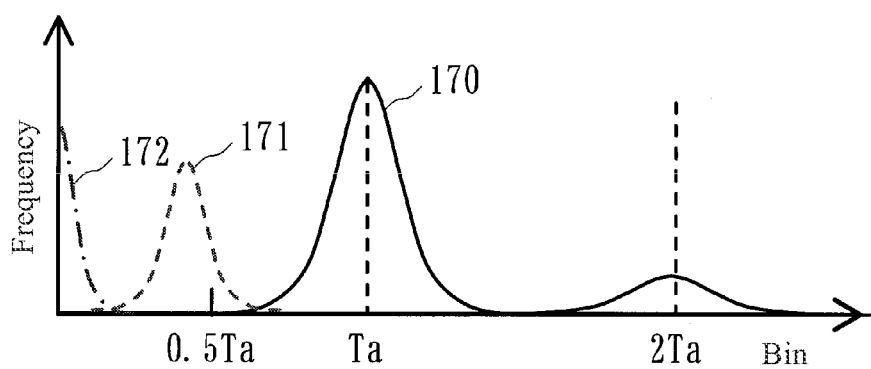
FIG. 6 is a diagram illustrating one example of a frequency distribution of mode hop pulse periods in the case of a high-frequency noise mixed into the signal that is inputted into the counting device.

FIG. 6 is a diagram illustrating one example of a frequency distribution of periods of MHPs when high-frequency noise is mixed into the signal that is inputted into the counting device. When high-frequency noise is mixed into the input signal, the MHP period frequency distribution, as illustrated in FIG. 6, has, in addition to the distribution 170 that has a local maximum value for the frequency at the conventional period Ta for the MHP, a distribution 171 that has a local maximum value for the distribution at a period that is approximately half the period Ta, and a short period 172 of the noise. Given this, because of the high-frequency noise that is mixed in, there is a tendency for the times to shift towards the short side when the frequencies have local maximum values. This high-frequency noise may be mixed in continuously. In the conventional counting device disclosed in JP '676, it is not possible to adequately correct the MHP counting result when high-frequency noise is mixed in continuously. This type of problem is described in detail in JP '525.

Figure 7:
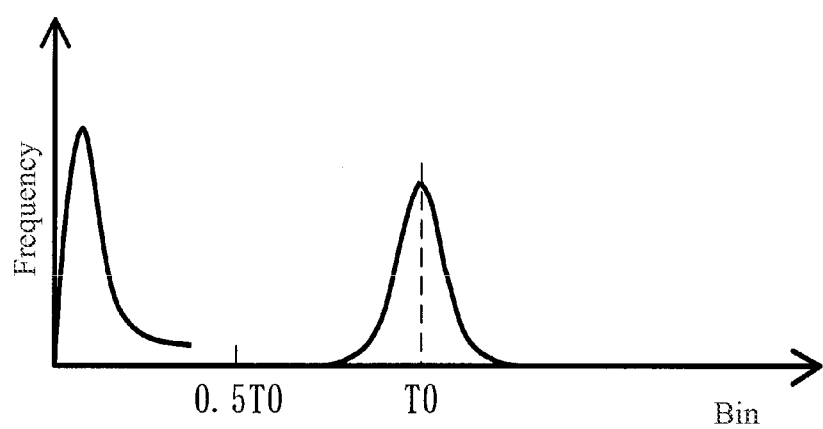
FIG. 7 is a diagram illustrating one example of a frequency distribution of the mode hop pulse run lengths.

Given this, in the present example a representative value T0 for the MHP run lengths is used, in the same manner as in JP '525, rather than a representative value for the MHP periods, to correct the counting results. An example of the MHP run length frequency distribution is illustrated in FIG. 7. As is clear from FIG. 7, when calculating the MHP run length frequency distribution, no local maximum value appears for the frequency in the vicinity of 0.5 T0, even when high-frequency noise is mixed into the signal that is inputted into the counting device 1. That is, local maximum values for the frequencies disappear in the vicinity of the threshold values for calculating the total $Ns_H$ and $Ns_L$ numbers for the run lengths, thus making it possible to calculate the aforementioned $Ns_H$ and $Ns_L$ correctly, to make it possible to control the error in the correction.

Figure 8:
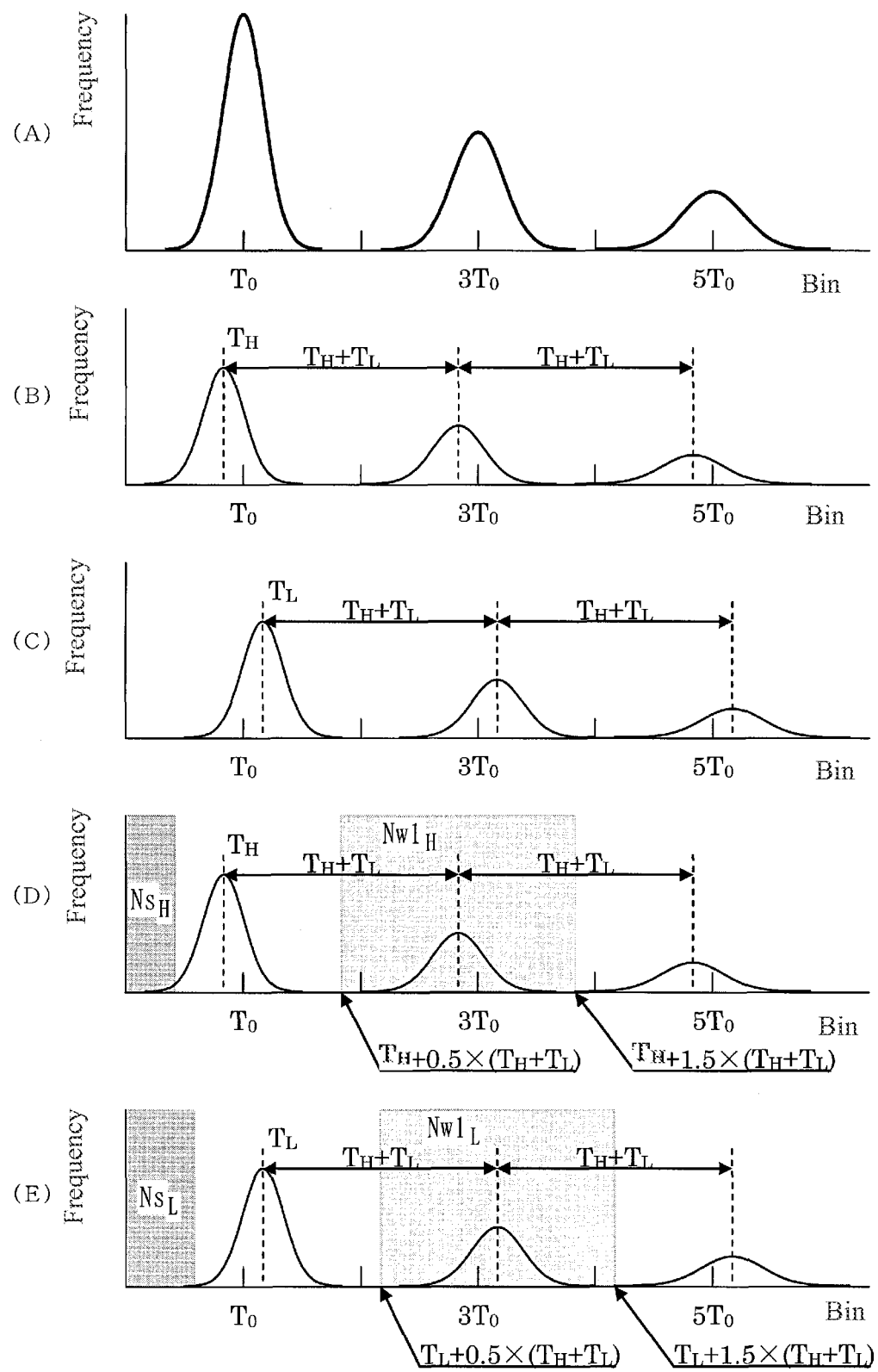
FIG. 8 is a diagram for explaining the principle of correcting the results of counting by the counting device according to an example.

However, in the counting device disclosed in JP '525, if the MHP waveform is asymmetrical in respect to time, then the MHP run length frequency distribution will not appear as illustrated in FIG. 7 or FIG. 8(A), but rather will be in a form that has the mode value (the maximum frequency value) at $T_H$, as illustrated in FIG. 8(B), or a shape that has a mode value at $T_L$, as illustrated in FIG. 8(C). If the MHP waveform is symmetrical in respect to time, then when there is an omission in the MHP waveform due to noise, then a run length that is an odd multiple of T0 will be produced. This produces the local maximum values for the frequencies at, for example, 3T0 and 5T0 of FIG. 8(A).

Figure 11:
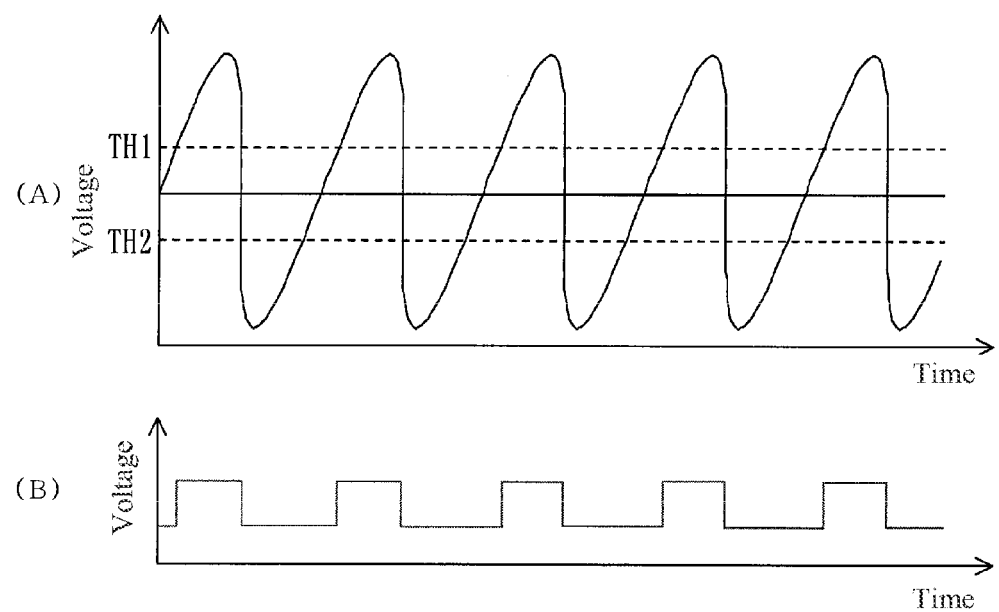
FIG. 11 is a diagram illustrating an interference waveform that is asymmetrical in respect to time.

On the other hand, when the MHP waveform is asymmetrical in respect to time, as illustrated in FIG. 11(A), then when there is an omission in the MHP waveform, a run length of a length that satisfies a value of an integer multiple of $(T_H+T_L)$ will be produced for $T_H$, and a run length of a length that satisfies a value that is an integer multiple of $(T_H+T_L)$ will be produced for $T_L$. When there are omissions in the MHP waveform, then a run length wherein 2n+1 run lengths have become a single run length will, in the case of the first run lengths tud, be $T_H+n\times(T_H+T_L)$ and, in the case of the second run lengths tdu, will be $T_L+n\times(T_H+T_L)$. Because noise of a variety of different frequencies is superimposed on the MHPs, the run lengths will have a Gaussian distribution centered on $T_H+n\times(T_H+T_L)$ and a Gaussian distribution centered on $T_L+n\times(T_H+T_L)$. As a result, in the example in FIG. 8(B), there are local maximum values for the frequencies at $T_H+(T_H+T_L)$ and $T_H+2(T_H+T_L)$, and there are local maximum values for the frequencies at $T_L+(T_H+T_L)$ and $T_L+2(T_H+T_L)$.

Given this, in the present example, the threshold value for calculating the total $Nw_{nH}$ number of first run lengths tud is defined as no less than $\{T_H+(n-0.5)\times(T_H+T_L)\}$ and less than $\{T_H+(n+0.5)\times(T_H+T_L)\}$, and the threshold value for calculating the total $Nw_{nL}$ number of second run lengths tdu is defined as no less than $\{T_L+(n-0.5)\times(T_H+T_L)\}$ and less than $\{T_L+(n+0.5)\times(T_H+T_L)\}$. Doing so makes it possible to calculate $(Nw_{nH}+Nw_{nL})$ properly, making it possible to control the error in the correction.

The total $Ns_H$ number of first run lengths tud that are no less than 0 times and less than 1 times the representative value $T_H$, and the total $Nw_{1H}$ number of first run lengths that are no less than $\{T_H+0.5\times(T_H+T_L)\}$ and less than $T_H+1.5\times(T_H+T_L)\}$ are illustrated in the example in FIG. 8(D), and the total $Ns_L$ number of first run lengths tdu that are no less than 0 times and less than 1 times the representative value $T_L$, and the total $Nw_{1L}$ number of second run lengths that are no less than $\{T_L+0.5\times(T_H+T_L)\}$ and less than $T_L+1.5\times(T_H+T_L)\}$ are illustrated in the example in FIG. 8(E). The above is the principal for correcting the counting results shown in Equation (1). Note that the reason for the ½ times on the right side in Equation (1) is because of the conversion of the number of MHP run lengths into the number of MHPs.

As described above, in the present example, the number of run lengths of MHPs in a counting interval is counted by the counter 13, the run lengths of the MHPs in the counting interval are measured, frequency distributions of run lengths of MHPs during the counting interval are generated from the measurement results for first run lengths, which are from the rising edge of an MHP until the subsequent falling edge and for second run lengths, which are from the falling edge of an MHP until the subsequent rising edge, a representative value $T_H$ for the distribution of the first run lengths is calculated from the frequency distribution of the first run lengths and a representative $T_L$ for the distribution of the second run lengths is calculated from the frequency distribution of the second run lengths, a total $Ns_H$ number of first run lengths wherein the length is no less than 0 times and less than 1 times the representative value $T_H$, a total $Ns_L$ number of second run lengths wherein the length is no less than 0 times and less than 1 times the representative value $T_L$, a total $Nw_{nH}$ number of first run lengths wherein the lengths are no less than $\{T_H+n-0.5)\times(T_H+T_L)\}$ and less than $\{T_H+n+0.5)\times(T_H+T_L)\}$, and a total $Nw_{nL}$ number of second run lengths wherein the lengths are no less than $\{T_L+n-0.5)\times(T_H+T_L)\}$ and less than $\{T_L+n+0.5)\times(T_H+T_L)\}$ are calculated, and the result of counting by the counter 13 is corrected based on these frequencies $Ns_H$, $Ns_L$, $Nw_{nH}$, and $Nw_{nL}$, thereby making it possible to correct, with high accuracy, the MHP counting error, even when there is continuous noise at a frequency higher than that of the MHPs in the signal that is inputted into the counting device, even when the MHP waveform is asymmetric in respect to time.

Note that in the present example, the counting device 1 may be achieved through, for example, a computer that is provided with a CPU, a storage device, and an interface, and through a program that controls these hardware resources. The program for operating such computer is provided in a state that is stored on a storage medium such as a floppy disk, a CD-ROM, a DVD ROM, a memory card, or the like. A CPU writes to a storage the device a program that has been read, to thereby achieve the processes described in the present example following the program.

Moreover, while in the example the explanation was for a case wherein the counting device according to the present invention is applied to a laser measuring device, there is no limitation thereto, but rather the counting device according to the present example can be applied also to other fields, such as photoelectric sensors. Cases wherein the counting device according to the present example are useful include cases wherein there is a linear relationship between the number of signals to be counted and a specific physical quantity (which, in the present example, is the distance between the semiconductor laser and the object, and a dislocation of the object), where if the specific physical quantity is a constant, the signal has essentially a single frequency. Moreover, the counting device according to the present example is effective when, rather than the signal being a single frequency, it is essentially a single frequency in a case wherein the spread in the period distribution is small, such as when the specific physical quantity is the speed of an object that is vibrating at a frequency that is adequately low when compared to the measuring interval, such as a frequency that is no more than $1/10$ the inverse of the measuring interval.

Moreover, while in the present example the explanation was for a case of a laser measuring instrument for calculating the distance to an object and the speed of the object from the results of counting by a counting device such as disclosed in JP '080, as an example of a physical quantity sensor to which the counting device is applied, there is no limitation thereto, but rather the present example may be applied to other physical quantity sensors. That is, the tension of an object may be calculated from the counting results by the counting device, or the vibrational frequency of an object may be calculated from the counting results of the counting device. As is clear from the variety of different physical quantities calculated by the physical quantity sensor, the specific physical quantity referenced above may be the same as the physical quantity calculated by the physical quantity sensor, or may be different.

Note that the input signal in the present example indicates events or wave motions (in the case of self-coupling, interference patterns) in quantities that change continuously (which, in the case of self-coupling, are the self-coupled signals).

The present invention can be applied to counting devices for counting signals.

The invention claimed is:

1. A counting device counting signals wherein there is a linear relationship between a specific physical quantity and the number of signals and wherein the signal has essentially a single frequency when the specific physical quantity is constant, comprising:

a binarizing device binarizing an inputted signal;
a signal counter counting a number of run lengths of the binarized signal outputted from the binarizing device during a prescribed counting interval;
a run length measuring device measuring the run lengths of a binarized signal during the counting interval each time a run length worth of a signal is inputted;
a frequency distribution generator generating a frequency distribution for the run lengths of the binarized signals during the counting interval, from the measurement results by the run length measuring device, for first run lengths, which are from a rising edge until the subsequent falling edge of the binarized signal, and second run lengths, which are from a falling edge to the subsequent rising edge of the binarized signal;
a representative value calculator calculating a representative value $T_H$ for the distribution of the first run lengths from the first run length frequency distribution and calculating a representative value $T_L$ for the distribution of the second run lengths from the second run length frequency distribution; and
a corrected value calculator calculating a total $Ns_H$ number of first run lengths wherein the length is no less than 0 times and less than 1 times the representative value $T_H$, a total $Ns_L$ number of second run lengths wherein the length is no less than 0 times and less than 1 times the representative value $T_L$, a total $Nw_{nH}$ number of first run lengths wherein the lengths are no less than $\{T_H+n-0.5)\times(T_H+T_L)\}$ and less than $\{T_H+n+0.5)\times(T_H+T_L)\}$, and a total $Nw_{nL}$ number of second run lengths wherein the lengths are no less than $\{T_L+n-0.5)\times(T_H+T_L)\}$ and less than $\{T_L+n+0.5)\times(T_H+T_L)\}$, and calculating a number of inputted signals by correcting the counting results by the signal counting means based on these frequencies $Ns_H$, $Ns_L$, and $Nw_{nH}$, and $Nw_{nL}$.

2. The counting device as set forth in claim 1, wherein: the corrected value calculator calculates a post-correction calculation result N' through:

$$N' = \frac{1}{2}\left[N - (Ns_H + Ns_L) + \sum_{n=1}^{n_{max}} \{2n \times (Nw_{nH} + Nw_{nL})\}\right]$$

$$n_{max} \leq \frac{(T_H + T_L)_{max}}{T_H + T_L}$$

when the counting result by the signal counter is defined as N, and the maximum value that can be assumed by the sum of a first run length and a second run length is defined as $(T_H+T_L)_{max}$.

3. The counting device as set forth in claim 1, wherein: the representative values $T_H$ and $T_L$ are each a median value, a modal value, a mean value, a bin value wherein the product of the bin value and the frequency is a maximum, or a bin value wherein the product of the bin value raised to the a power (where 0<a<1) and the frequency is a maximum.

4. The counting device as set forth in claim 1 wherein: a threshold value for calculating the total $Ns_H$ number of first run lengths is no less than 0 times and less than 0.5 times the representative value $T_H$ or no less than 0 times the representative value $T_H$ and less than $(T_H+T_L)/4$; and
a threshold value for calculating the total $Ns_L$ number of second run lengths is no less than 0 times and less than 0.5 times the representative value $T_L$ or no less than 0 times the representative value $T_L$ and less than $(T_H+T_L)/4$.

5. A counting method counting signals wherein there is a linear relationship between a specific physical quantity and the number of signals and wherein the signal has essentially a single frequency when the specific physical quantity is constant, comprising the steps of:

a binarizing step binarizing an inputted signal;

a signal counting step counting a number of run lengths of the binarized signal outputted from the binarizing step during a prescribed counting interval;

a run length measuring step measuring the run lengths of a binarized signal during the counting interval each time a run length worth of a signal is inputted;

a frequency distribution generating step generating a frequency distribution for the run lengths of the binarized signals during the counting interval, from the measurement results by the run length measuring step, for first run lengths, which are from a rising edge until the subsequent falling edge of the binarized signal, and second run lengths, which are from a falling edge to the subsequent rising edge of the binarized signal;

a representative value calculating step calculating a representative value $T_H$ for the distribution of the first run lengths from the first run length frequency distribution and for calculating a representative value $T_L$ for the distribution of the second run lengths from the second run length frequency distribution; and a corrected value calculating step calculating a total $Ns_H$ number of first run lengths wherein the length is no less than 0 times and less than 1 times the representative value $T_H$, a total $Ns_L$ number of second run lengths wherein the length is no less than 0 times and less than 1 times the representative value $T_L$, a total $Nw_{nH}$ number of first run lengths wherein the lengths are no less than $\{T_H+n-0.5)\times(T_H+T_L)\}$ and less than $\{T_H+n+0.5)\times(T_H+T_L)\}$, and a total $Nw_{nL}$ number of second run lengths wherein the lengths are no less than $\{T_L+n-0.5)\times(T_H+T_L)\}$ and less than $\{T_L+n+0.5)\times(T_H+T_L)\}$, and for calculating a number of inputted signals by correcting the counting results by the signal counting step based on these frequencies $Ns_H$, $Ns_L$, and $Nw_{nH}$, and $Nw_{nL}$.

6. The counting method as set forth in claim 5, wherein:
the corrected value calculating step calculates a post-correction calculation result N' through:

[Equation 2]

$$N' = \frac{1}{2}\left[N - (Ns_H + Ns_L) + \sum_{n=1}^{n_{max}} \{2n \times (Nw_{nH} + Nw_{nL})\}\right]$$

$$n_{max} \leq \frac{(T_H + T_L)_{max}}{T_H + T_L}$$

when the counting result by the signal counting step is defined as N, and the maximum value that can be assumed by the sum of a first run length and a second run length is defined as $(T_H+T_L)_{max}$.

7. The counting method as set forth in claim 5, wherein:
the representative values $T_H$ and $T_L$ are each a median value, a modal value, a mean value, a bin value wherein the product of the bin value and the frequency is a maximum, or a bin value wherein the product of the bin value raised to the a power (where 0<a<1) and the frequency is a maximum.

8. The counting method as set forth in claim 5, wherein:
a threshold value calculating the total $Ns_H$ number of first run lengths is no less than 0 times and less than 0.5 times the representative value $T_H$ or no less than 0 times the representative value $T_H$ and less than $(T_H+T_L)/4$; and a threshold value calculating the total $Ns_L$ number of second run lengths is no less than 0 times and less than 0.5 times the representative value $T_L$ or no less than 0 times the representative value $T_L$ and less than $(T_H+T_L)/4$.

\* \* \* \* \*